(12) United States Patent
Tillack et al.

(10) Patent No.: US 8,546,249 B2
(45) Date of Patent: Oct. 1, 2013

(54) SELECTIVE GROWTH OF POLYCRYSTALLINE SILICON-CONTAINING SEMICONDUCTOR MATERIAL ON A SILICON-CONTAINING SEMICONDUCTOR SURFACE

(75) Inventors: Bernd Tillack, Frankfurt (DE); Bernd Heinemann, Frankfurt (DE); Yuji Yamamoto, Frankfurt (DE)

(73) Assignee: IHP GmbH—Innovations for High Performance, Frankfurt (DE)

( * ) Notice: Subject to any disclaimer, the term of this patent is extended or adjusted under 35 U.S.C. 154(b) by 0 days.

(21) Appl. No.: 12/449,335

(22) PCT Filed: Feb. 15, 2008

(86) PCT No.: PCT/EP2008/051875
§ 371 (c)(1),
(2), (4) Date: Oct. 23, 2009

(87) PCT Pub. No.: WO2008/101877
PCT Pub. Date: Aug. 28, 2008

(65) Prior Publication Data
US 2010/0055880 A1    Mar. 4, 2010

(30) Foreign Application Priority Data
Feb. 22, 2007    (DE) .................. 10 2007 010 563

(51) Int. Cl.
*H01L 29/04*        (2006.01)
*C23C 16/24*        (2006.01)
*H01L 33/16*        (2010.01)

(52) U.S. Cl.
CPC .................... *C23C 16/24* (2013.01)
USPC .............. 438/488; 438/558; 257/51; 257/65; 257/505; 257/E29.003; 257/E21.133; 257/E21.197

(58) Field of Classification Search
USPC ............... 438/365, 417, 482–483, 486–489, 438/491, 558, 764, 969, FOR. 138, FOR. 259, 438/FOR. 269, FOR. 322, FOR. 346, FOR. 393, 438/FOR. 478; 257/51, 65, 73, 381, 385, 257/505, 518, 538, 554, 914, E31.043, E29.003, 257/E29.292, E23.164, E21.133, E21.197, 257/E21.297, E21.316, E21.412, E21.572
See application file for complete search history.

(56) References Cited

U.S. PATENT DOCUMENTS 3,651,385 A * 3/1972 Kobayashi .................. 257/64
3,825,451 A * 7/1974 Schoeff ...................... 438/417
(Continued)

FOREIGN PATENT DOCUMENTS

DE    25 11 773        10/1975
DE    44 45 177 C2     5/1996
(Continued)

OTHER PUBLICATIONS

Theortical Modeling of Thin Film Growth in the B-N System, Björn Mårlid, Uppsala University, Sweden, 2001.*

*Primary Examiner* — Matthew Landau
*Assistant Examiner* — Maliheh Malek
(74) *Attorney, Agent, or Firm* — Ware, Fressola, Maguire & Barber LLP

(57) ABSTRACT

A method of depositing polycrystalline silicon exclusively on monocrystalline first silicon surface portions of a substrate surface which besides the first surface portions additionally has insulator surface portions, comprising the steps of depositing boron on the first silicon surface portions in an amount which in relation to the first silicon surface portions respectively corresponds to more than a monolayer of boron, and depositing silicon on the first silicon surface portions treated in that way.

15 Claims, 3 Drawing Sheets

(56) References Cited

U.S. PATENT DOCUMENTS

| | | | |
|---|---|---|---|
| 3,874,920 A * | 4/1975 | Chappelow et al. | 438/764 |
| 3,936,331 A * | 2/1976 | Luce et al. | 438/673 |
| 4,283,235 A * | 8/1981 | Raffai et al. | 438/330 |
| 4,523,370 A * | 6/1985 | Sullivan et al. | 438/365 |
| 4,717,681 A * | 1/1988 | Curran | 438/314 |
| 4,960,732 A * | 10/1990 | Dixit et al. | 438/628 |
| 5,455,447 A * | 10/1995 | Hutter et al. | 257/545 |
| 5,753,530 A | 5/1998 | Akamine et al. | 438/560 |
| 6,043,138 A * | 3/2000 | Ibok | 438/493 |
| 6,068,928 A * | 5/2000 | Schrems et al. | 428/446 |
| 6,124,181 A * | 9/2000 | Ueda | 438/350 |
| 6,162,711 A * | 12/2000 | Ma et al. | 438/558 |
| 6,239,477 B1 * | 5/2001 | Johnson | 257/592 |
| 6,429,101 B1 * | 8/2002 | Amos et al. | 438/488 |
| 6,488,776 B2 * | 12/2002 | Wang | 118/715 |
| 6,593,174 B2 * | 7/2003 | Blanchard | 438/151 |
| 6,610,578 B2 * | 8/2003 | Norstrom et al. | 438/369 |
| 6,958,175 B2 * | 10/2005 | Sakamoto et al. | 427/569 |
| 7,205,606 B2 * | 4/2007 | Tran | 257/330 |
| 7,307,336 B2 * | 12/2007 | Ehwald et al. | 257/565 |
| 7,465,499 B2 * | 12/2008 | Udagawa et al. | 428/446 |
| 7,828,987 B2 * | 11/2010 | Schneider et al. | 216/67 |
| 8,084,105 B2 * | 12/2011 | Huh et al. | 427/576 |
| 8,148,269 B2 * | 4/2012 | Balseanu et al. | 438/706 |
| 2003/0124761 A1 * | 7/2003 | Baert et al. | 438/50 |
| 2003/0224217 A1 * | 12/2003 | Byun et al. | 428/698 |
| 2004/0075118 A1 * | 4/2004 | Heinemann et al. | 257/205 |
| 2004/0266142 A1 * | 12/2004 | Tillack et al. | 438/478 |
| 2005/0006724 A1 * | 1/2005 | Ehwald et al. | 257/588 |
| 2005/0037598 A1 * | 2/2005 | Witvrouw | 438/488 |
| 2005/0059198 A1 * | 3/2005 | Visokay et al. | 438/199 |
| 2005/0066892 A1 * | 3/2005 | Dip et al. | 118/715 |
| 2005/0118804 A1 * | 6/2005 | Byun et al. | 438/674 |
| 2005/0173768 A1 * | 8/2005 | Lee et al. | 257/401 |
| 2005/0272187 A1 * | 12/2005 | Murthy et al. | 438/151 |
| 2006/0019486 A1 * | 1/2006 | Yu et al. | 438/628 |
| 2006/0051911 A1 * | 3/2006 | Gu et al. | 438/166 |
| 2006/0172501 A1 * | 8/2006 | Ueno et al. | 438/300 |
| 2006/0240634 A1 * | 10/2006 | Tran | 438/400 |
| 2006/0267012 A1 * | 11/2006 | Maegawa et al. | 257/57 |
| 2007/0042572 A1 * | 2/2007 | Bauer | 438/478 |
| 2007/0128858 A1 * | 6/2007 | Haukka et al. | 438/656 |
| 2007/0176232 A1 * | 8/2007 | Tran | 257/330 |
| 2007/0278621 A1 * | 12/2007 | Rucker et al. | 257/592 |
| 2008/0213987 A1 * | 9/2008 | Deixler et al. | 438/488 |
| 2008/0292798 A1 * | 11/2008 | Huh et al. | 427/343 |
| 2008/0296506 A1 * | 12/2008 | Clarke et al. | 250/370.05 |
| 2009/0130806 A1 * | 5/2009 | Sedlmaier et al. | 438/192 |
| 2009/0191705 A1 * | 7/2009 | Liu et al. | 438/653 |
| 2009/0203184 A1 * | 8/2009 | Magnee et al. | 438/369 |
| 2009/0263972 A1 * | 10/2009 | Balseanu et al. | 438/696 |
| 2010/0019326 A1 * | 1/2010 | Knoll et al. | 257/370 |
| 2010/0047605 A1 * | 2/2010 | Knoblauch et al. | 428/554 |
| 2010/0219350 A1 * | 9/2010 | Kobashi et al. | 250/370.1 |
| 2010/0255662 A1 * | 10/2010 | Witvrouw | 438/479 |

FOREIGN PATENT DOCUMENTS

| | | |
|---|---|---|
| EP | 0 116 702 | 8/1984 |
| WO | WO 2008/015211 | 2/2008 |

* cited by examiner

SELECTIVE GROWTH OF POLYCRYSTALLINE SILICON-CONTAINING SEMICONDUCTOR MATERIAL ON A SILICON-CONTAINING SEMICONDUCTOR SURFACE

CROSS REFERENCE TO RELATED APPLICATIONS

This application is for entry into the U.S. national phase under §371 for International Application No. PCT/EP2008/051875 having an international filing date of Feb. 15, 2008, and from which priority is claimed under all applicable sections of Title 35 of the United States Code including, but not limited to, Sections 120, 363 and 365(c), and which in turn claims priority under 35 USC §119 to German Patent Application No. 10 2007 010 563.2 filed on Feb. 22, 2007.

BACKGROUND OF THE INVENTION

1. Technical Field

The invention concerns a method of depositing polycrystalline silicon-bearing semiconductor material exclusively on monocrystalline first silicon-bearing semiconductor surface portions of a substrate surface which in addition has insulator surface portions.

2. Discussion of Related Art

Depositing polycrystalline silicon on monocrystalline silicon surface portions of a substrate surface is at the present time successful only if the monocrystalline silicon surface portions are covered with a thin silicon dioxide layer. For many component applications however the presence of an oxide layer between monocrystalline silicon and polycrystalline silicon causes problems.

The problem also correspondingly arises in regard to depositing silicon germanium or carbon-doped silicon or carbon-doped silicon germanium. It does not only arise in connection with silicon surfaces but also in the case of surfaces of silicon germanium or carbon-doped silicon or carbon-doped silicon germanium.

Therefore the underlying technical object of the invention is that of providing a method with which polycrystalline silicon-bearing semiconductor material can be deposited directly on monocrystalline silicon-bearing semiconductor surface portions of a substrate surface.

That technical object is attained by a method of depositing polycrystalline silicon-bearing semiconductor material exclusively on monocrystalline first silicon-bearing semiconductor surface portions, hereinafter referred to as first surface portions, of a substrate surface which besides the first surface portions additionally has insulator surface portions, comprising the steps:

depositing boron on the first surface portions in an amount which in relation to the first surface portions respectively corresponds to more than a monolayer of boron; and

DISCLOSURE OF THE INVENTION depositing silicon-bearing semiconductor material on the first surface portions treated in that way.

The method according to the invention is successful in depositing polycrystalline silicon-bearing semiconductor material, for example silicon or silicon germanium, selectively on the monocrystalline first surface portions of the substrate surface. "Selective" signifies in this context that deposition is effected exclusively on the monocrystalline first surface portions and not on the insulator surface portions of the substrate surface.

The method is based on the realization that the deposition of boron on the first surface portions in an amount which in relation to the first surface portions respectively corresponds to more than a monolayer of boron provides a substrate surface suitable for the growth of polycrystalline silicon-bearing semiconductor material. The boron deposition covers the monocrystalline first surface portions so that the lattice structure of the surface portions, in the subsequent deposition of silicon-bearing semiconductor material on the boron deposition, can no longer affect the structure of the growing silicon. Non-epitaxial growth of polycrystalline silicon-bearing semiconductor material therefore takes place.

The method according to the invention permits a selection of the surface portions on which polycrystalline silicon-bearing semiconductor material is to be deposited. It therefore enhances the flexibility in regard to the configuration of the layer structures of semiconductor components with silicon-bearing semiconductor layers. A specific embodiment by way of example is described in that respect hereinafter.

In accordance with the inventors' findings the deposit of boron in an amount which in relation to the first surface portions respectively corresponds to less than a monolayer of boron leads not to polycrystalline but to epitaxial growth.

As explained hereinbefore the term "first surface portions" is used here for silicon-bearing semiconductor surface portions. These therefore involve portions of the substrate surface, which are formed by a silicon-bearing semiconductor material. The first surface portions can also be carbon-doped. The proportion of carbon in that respect can be between values of unintentional background doping and some percent, that is to say in the region of up to some $10^{22}$ cm$^{-3}$. For the purposes of this application silicon carbide is not deemed to be embraced by the term "silicon-bearing semiconductor material".

Other dopants such as oxygen or dopants for achieving a desired conductivity such as for example phosphorus, arsenic, boron or aluminum can be included in the usual levels of concentration, in which respect however neither the silicon-bearing semiconductor surface portions nor the deposited material involve degeneracy (metallic conductivity).

The semiconductor material is for example silicon or silicon germanium, with or without carbon doping. The proportion of germanium is typically up to 20% but can also be higher than that. The method according to the invention, in a particular embodiment, can even be used for the deposition of germanium on a germanium or silicon germanium surface. It would therefore be alternatively possible in the description of the method according to the invention to use for the deposited semiconductor material as for the material of the substrate surface to be covered therewith, the term "silicon and/or germanium-bearing semiconductor material" which includes silicon, silicon germanium and germanium each with or without carbon doping, but is intended to exclude silicon carbide.

Embodiments by way of example of the method according to the invention are described hereinafter. The embodiments can be combined together if they are not described expressly as alternatives to each other.

It is not necessary, and in the foregoing description of implementation of the method, it is not to be interpreted as a necessary condition, for boron to be deposited exclusively on the first surface portions. In an embodiment elemental boron is deposited on the substrate surface in a non-masked procedure, which includes the first silicon surface portions and the insulator surface portions. Then, in that embodiment, silicon or silicon germanium is deposited, leading to the selective formation of a polycrystalline layer of that material on the first surface portions. In this embodiment, no deposition takes place on the insulator surface portions. Alternatively, it is also possible to effect masked deposition of elemental boron exclusively on the first silicon surface portions, which however is more complicated and expensive.

In an embodiment the step of depositing silicon-bearing semiconductor material is carried out under deposition conditions of epitaxial deposition. That method, in a development, permits the simultaneous deposition of polycrystalline and monocrystalline semiconductor material. Such a method in which the substrate surface additionally includes second silicon-bearing semiconductor surface portions, referred to for brevity as "second surface portions", for the monocrystalline deposition, can comprise for example the following additional steps:

covering the second surface portions with a mask prior to the deposition of boron on the first surface portions;

depositing a polycrystalline silicon germination layer on the first surface portions;

removing the mask from the second surface portions; and simultaneously depositing the polycrystalline silicon-bearing semiconductor material on the first surface portions and epitaxial silicon on the second surface portions.

The deposition of a polycrystalline silicon germination layer on the first surface portions uses the advantageous effect of boron deposition in this embodiment in the presence of a mask. Polycrystalline silicon can then selectively grow on the silicon germination layer in the later deposition layer, as is predetermined by the structure of the silicon germination layer. The silicon germination layer is typically some monolayers thick. The silicon germination layer also prevents the deposited boron being removed at the first silicon surface portions which are provided for a polycrystalline deposition, upon removal of the mask.

The method of this embodiment can also be carried out with a germination layer of silicon germanium or carbon-doped silicon or silicon germanium.

For a more detailed discussion of the term "second surface portion" reference can be made to the foregoing discussion of the term "first surface portion".

What is stated there in respect of the "first surface portion" also correspondingly applies here to the "second surface portion".

In a further embodiment elemental boron is deposited in an amount which in relation to the first surface portions respectively corresponds to more than two monolayers of elemental boron. For example the amount of elemental boron can correspond to 3, 7 or more monolayers of elemental boron. In that case the amount of elemental boron can be so selected as requires a desired boron concentration in the finished component. To produce a desired boron concentration in the deposited polycrystalline layer and the subjacent monocrystalline layer, an embodiment provides for performing a boron diffusion step after the deposition of silicon-bearing semiconductor material.

A particularly advantageous situation of use of the method of the present invention concerns the production of a partially polycrystalline emitter in pnp-heterobipolar transistors. In the case of such pnp-heterobipolar transistors it is advantageous on the one hand to deposit an emitter layer adjoining the base in epitaxial fashion, that is to say monocrystalline. Particularly advantageous electrical parameters for the heterobipolar transmitter such as emitter resistance and base current are achieved with the epitaxial emitter portion. On the other hand a polycrystalline emitter portion in the direction of the emitter contact is advantageous because in that way very high levels of dopant concentration ($>10^{20}$ cm$^{-3}$) can be introduced into that portion without harmful effects on the subjacent concentration profiles. In that way the electrical contact between the emitter and the emitter contact region typically including metal silicide is improved. In this example of use therefore the method according to the invention can be used during growth of the emitter. After the deposition of a monocrystalline emitter portion growth is interrupted. The growth surface of the monocrystalline emitter portions forms the first surface portions in the sense of the method according to the invention. They are then subjected to a boron deposition operation in accordance with the method implementation according to the invention, whereupon silicon is deposited, which then grows in polycrystalline fashion. Advantageously the deposited polycrystalline silicon is used in a subsequent method step for the production of a metal silicide layer. The deposited polycrystalline silicon-bearing semiconductor material is therefore either entirely or partially silicided. For example a nickel silicide layer is appropriate.

In different embodiments the insulator surface portions can contain silicon dioxide or silicon nitride.

Deposition of elemental boron on the first surface portions is preferably effected by means of the per se known atomic layer deposition (ALD). Atomic layer deposition is also known by the name atomic layer epitaxy (ALE). As is known, atomic layer deposition involves a modified CVD method (chemical vapor deposition). The number of deposited monolayers can be controlled with a particularly high degree of accuracy in that method.

Preferably the deposition of elemental boron is effected in this method by means of a gas flow of $B_2H_6$ as a precursor. In that case preferably hydrogen is used as the carrier gas. It has proven to be particularly desirable for the deposition of elemental boron to be effected in accordance with this method at a temperature of 400° C. That temperature range however can certainly be varied.

The subsequent deposition of silicon is effected in an embodiment using dichlorosilane (DCS) as a precursor. A hydrogen carrier gas is also suitable here. Deposition is preferably effected at a temperature of 700° C. Markedly lower deposition temperatures however can also be used.

For the deposition of silicon germanium it is possible for example to use germane ($GeH_4$) or germanium tetrachloride ($GeCl_4$) as the germanium precursor. Germane has the advantage that it can be activated like dichlorosilane at 700° C. so that the thermal budget of that procedural step can be kept down, in comparison with the use of germanium tetrachloride.

BRIEF DESCRIPTION OF THE DRAWINGS

The invention is described in greater detail hereinafter by means of embodiments by way of example with reference to the Figures in which.

DETAILED DESCRIPTION

Figure 1:
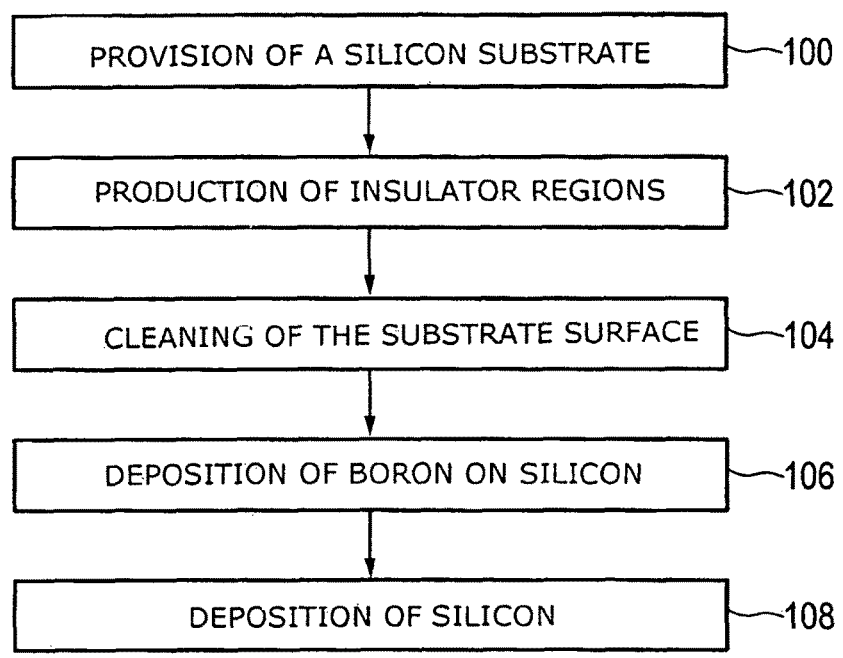
FIG. 1 shows a flow chart of an embodiment of the method according to the invention.
Figure 2:
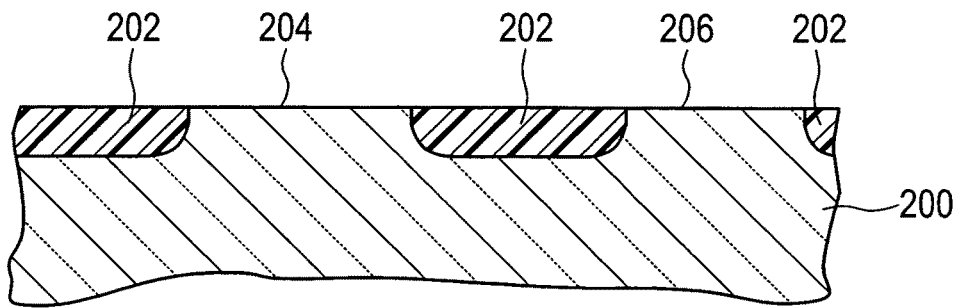
FIGS. 2-4 show diagrammatic cross-sectional views of a silicon substrate during different stages in the selective deposition of polycrystalline silicon on a silicon surface.
Figure 3:
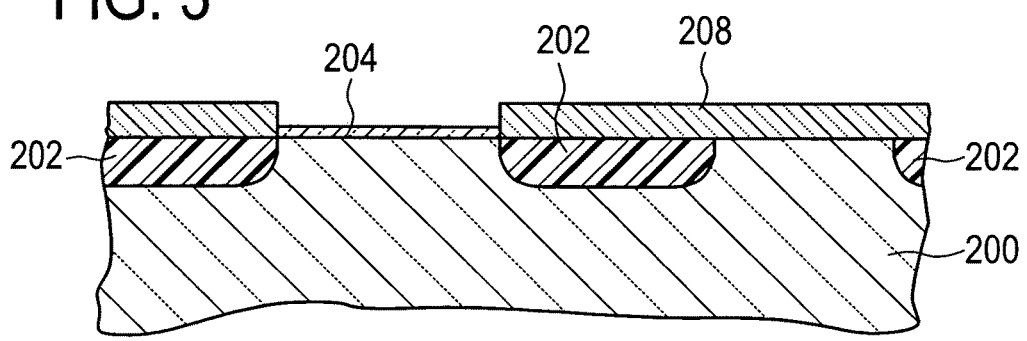
Figure 4:
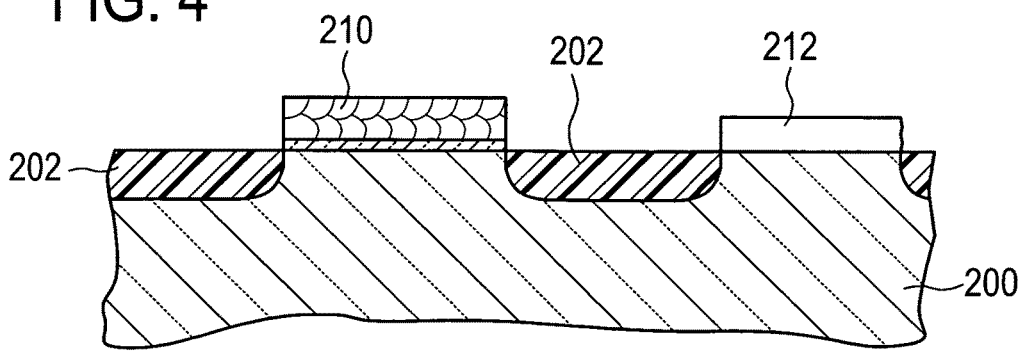

FIG. 1 shows a flow chart of an embodiment by way of example of the method according to the invention. FIG. 1 is described hereinafter in parallel with FIGS. 2 through 4. FIGS. 2 through 4 show diagrammatic cross-sectional views of a silicon substrate 200 during different stages in the selective deposition of polycrystalline silicon on a silicon surface.

The method begins at a step 100 with the provision of a silicon substrate. The silicon substrate has a monocrystalline silicon surface. The silicon substrate can be present for example in the form of a wafer with a (001) silicon surface. For the purposes of the present description it is assumed that the substrate 200 is such a wafer. The silicon substrate however can also be formed by a wafer in a later stage in the production of integrated circuits. For example the wafer can already include functional layers of pnp-heterobipolar transistors. In particular an epitaxial base layer and an epitaxial, that is to say monocrystalline emitter layer portion deposited thereon. Functional layers of MOS or CMOS transistors can also alternatively or additionally already be present.

In the simple embodiment described here however insulator regions 202 are firstly produced in a step 102. They separate different silicon surface portions from each other. In the preferred example there are a monocrystalline first silicon surface portion 204 and a monocrystalline second silicon surface portion 206. The substrate surface is then cleaned in a step 104 before, in a masked deposition step, elemental boron is deposited in an amount of more than one monolayer in the first silicon surface portion 204 (step 106). The deposition of elemental boron is effected for example by means of atomic layer deposition at a temperature of 400° C. In an embodiment $B_2H_6$ is used as the elemental boron precursor in an amount of 160 sccm corresponding to an amount of 250 ppn in a hydrogen carrier gas. The hydrogen carrier gas is prepared with 20 SLM at a pressure of 80 Torrs. After the elemental boron coating a polycrystalline Si germination layer is deposited. That polycrystalline Si layer can also serve as a seeding layer for polycrystalline growth if Si is epitaxially grown after removal of the mask 208 on a second silicon surface portion 206.

In this case a mask 208 serves for covering the second silicon surface portion 206. No polycrystalline silicon layer is to be subsequently deposited thereon. It is also conceivable that the second silicon surface portion 206 should be covered with an n-doped silicon layer.

Silicon is subsequently deposited on the substrate surface freed of the mask 208 (step 108). Deposition therefore takes place on the polycrystalline Si germination layer, in the first silicon surface portion. In an embodiment the deposition of silicon is effected at a temperature of 700° C. with DCS as the precursor. An amount of 50 sccm with hydrogen carrier gas of 20 SLM under a pressure of 80 Torrs are for example suitable.

Those conditions are suitable for providing for growth of a polycrystalline silicon layer 210 on the germination layer in the first silicon surface portion while no silicon is deposited on the insulating regions 202. At the same time however an epitaxial monocrystalline silicon layer 212 grows on the second silicon surface portion 206.

In a subsequent step diffusion of boron into the adjacent layers can be implemented by tempering the substrate 200. Diffusion can be prevented by the addition of carbon if that is desired for a given layer. By way of example the substrate 200 could be substantially protected from diffusion of boron thereinto by the incorporation of carbon in layers near the surface, near the first silicon surface portion 204.

Figure 5:
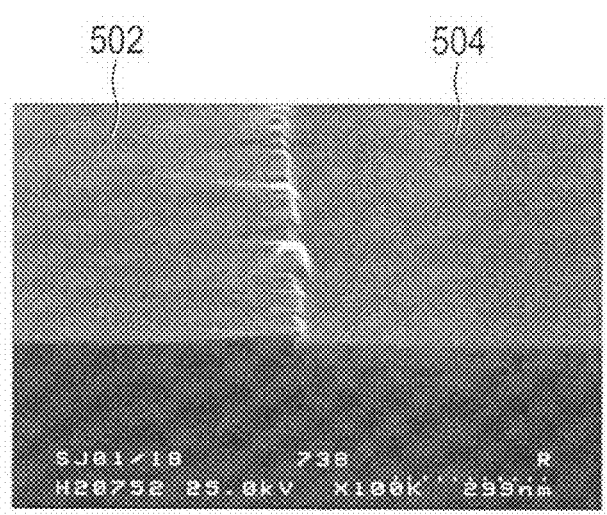
FIG. 5 shows a scanning electron microscope recording of a deposited silicon layer after previous deposition of 0.5 monolayers of boron.
Figure 6:
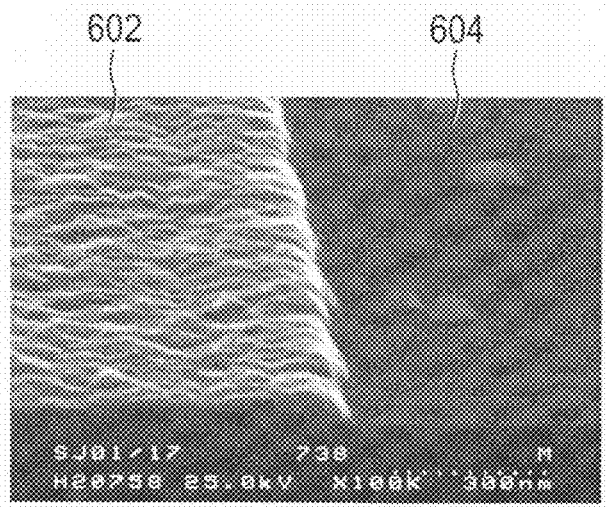
FIG. 6 shows a scanning electron microscope recording of a deposited silicon layer after previous deposition of 3 monolayers of boron.
Figure 7:
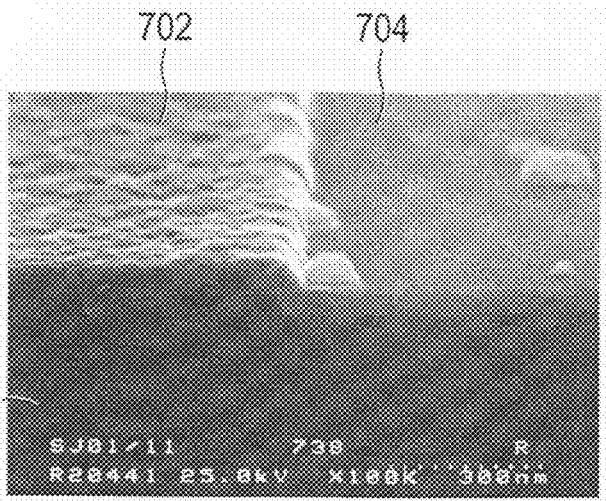
FIG. 7 shows a scanning electron microscope recording of a deposited silicon layer after previous deposition of 7 monolayers of boron.

FIG. 5 shows a scanning electron microscope recording of a deposited silicon layer after previous deposition of 0.5 monolayers of elemental boron. FIG. 6 shows a scanning electron microscope recording of a deposited silicon layer after previous deposition of 3 monolayers of elemental boron. FIG. 7 shows a scanning electron microscope recording of a deposited silicon layer after previous deposition of 7 monolayers of elemental boron.

FIG. 5 shows a scanning electron microscope recording of an epitaxial, substantially monocrystalline silicon layer 502 beside an insulator layer 504. That structure was not produced in accordance with a method according to the invention. For, an amount of boron was deposited on a silicon surface which is not visible in FIG. 5, beneath the silicon layer 502, which only corresponds to half a monolayer. Under those conditions it is not possible to produce polycrystalline silicon.

FIG. 6 shows in contrast that upon the deposition of an amount of boron corresponding to 3 monolayers a polycrystalline layer 602 can be selectively grown beside an insulator layer 604. The polycrystalline structure of the silicon layer 602 is clearly discernible in terms of its surface roughness in comparison with the epitaxial silicon layer 502. The epitaxial layer 502 in FIG. 5 thus exhibits as good as no surface contrast while that is strongly pronounced in the case of the layer 602.

FIG. 7 shows a result corresponding to FIG. 6 after using 7 monolayers of boron prior to selective deposition of a polycrystalline silicon layer 702 on the boron-covered silicon substrate 706. In this case also no silicon is deposited on an adjacent insulator layer 704.

The above-described method therefore permits a deposition of polycrystalline silicon on monocrystalline silicon surface portions of a substrate surface. That method is suitable for various applications in component manufacture. The manufacture of a partially crystalline emitter for pnp-heterobipolar transistors was described as an example.

The embodiments by way of example described with reference to the Figures are admittedly limited to the deposition of silicon on a silicon surface. That however is not to be interpreted restrictively. As explained in detail hereinbefore the method according to the invention can be used for various silicon-bearing materials to be deposited and it is possible to use for that purpose not just silicon surfaces but also other silicon-bearing semiconductor surfaces.

What is claimed is:

1. A method of depositing polycrystalline semiconductor material comprising silicon, exclusively on monocrystalline first semiconductor surface portions comprising silicon, hereinafter referred to as first surface portions, of a substrate surface which besides the first surface portions additionally has insulator surface portions, comprising:
   depositing elemental boron directly on the first surface portions in an amount, which in regard to each of the first surface portions corresponds to more than a monolayer of elemental boron; and
   depositing said polycrystalline semiconductor material on the first surface portions with the elemental boron deposited thereon.

2. The method as set forth in claim 1, in which the deposition of elemental boron is effected in a non-mask procedure on the substrate surface, including the first surface portions and the insulator surface portions.

3. The method as set forth in claim 1, in which the depositing the polycrystalline semiconductor material is carried out under deposition conditions of an epitaxial deposition.

4. The method as set forth in claim 3, in which the substrate surface additionally comprises second semiconductor surface portions comprising silicon, hereinafter referred to as second surface portions, the method further comprising:
- covering the second surface portions with a mask prior to the deposition of elemental boron on the first surface portions;
- depositing a polycrystalline silicon germination layer on the first surface portions;
- removing the mask from the second surface portions; and
- simultaneously depositing the polycrystalline semiconductor material on the first surface portions and epitaxial silicon on the second surface portions.

5. The method as set forth in claim 1, which comprises the deposition of elemental boron in an amount which in relation to the first surface portions respectively corresponds to more than two monolayers of elemental boron.

6. The method as set forth in claim 1, further comprising a boron diffusion step after the deposition of said polycrystalline semiconductor material comprising silicon.

7. The method as set forth in claim 1, in which the first surface portions form monocrystalline surface portions of an emitter of a pnp-heterobipolar transistor.

8. The method as set forth in claim 4, in which the first surface portions form monocrystalline surface portions of an emitter of a pnp-heterobipolar transistor and in which after the deposition of said polycrystalline semiconductor material, the deposited polycrystalline semiconductor material is either completely or partially silicided.

9. The method as set forth in claim 1, in which the insulator surface portions contain silicon dioxide or silicon nitride.

10. The method as set forth in claim 1, in which the elemental boron is deposited by means of atomic layer deposition.

11. The method as set forth in claim 10, in which the elemental boron is deposited by means of a gas flow of $B_2H_6$ in hydrogen carrier gas at a temperature of 400° C.

12. The method as set forth in claim 1, in which the polycrystalline semiconductor material is deposited using dichlorosilane as a silicon precursor in a hydrogen carrier gas at a temperature of 700° C.

13. The method as set forth in claim 1, in which the polycrystalline semiconductor material is silicon, silicon germanium, silicon with carbon doping, or silicon germanium with carbon doping.

14. The method as set forth in claim 1, in which the first semiconductor surface portions are formed from silicon, silicon germanium, silicon with carbon doping, or silicon germanium with carbon doping.

15. The method as set forth in claim 4, in which the first and second semiconductor surface portions are formed from silicon, silicon germanium, silicon with carbon doping, or silicon germanium with carbon doping.

* * * * *